United States Patent
Terasawa et al.

(10) Patent No.: US 9,768,763 B2
(45) Date of Patent: Sep. 19, 2017

(54) DRIVE CONTROL METHOD OF POWER SEMICONDUCTOR MODULE AND CONTROL CIRCUIT OF POWER SEMICONDUCTOR MODULE

(71) Applicant: FUJI ELECTRIC CO., LTD., Kawasaki-shi, Kanagawa (JP)

(72) Inventors: Noriho Terasawa, Kawasaki (JP); Yasuyuki Momose, Kawasaki (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 96 days.

(21) Appl. No.: 14/985,091

(22) Filed: Dec. 30, 2015

(65) Prior Publication Data
US 2016/0118974 A1 Apr. 28, 2016

Related U.S. Application Data

(63) Continuation of application No. PCT/JP2014/075346, filed on Sep. 25, 2014.

(30) Foreign Application Priority Data

Nov. 22, 2013 (JP) .................. 2013-242221

(51) Int. Cl.
*H02H 3/00* (2006.01)
*H03K 17/082* (2006.01)
(Continued)

(52) U.S. Cl.
CPC ............. *H03K 17/082* (2013.01); *H02H 3/16* (2013.01); *H03K 17/0828* (2013.01);
(Continued)

(58) Field of Classification Search
USPC .......................... 361/86–87, 93.7–93.9, 103
See application file for complete search history.

(56) References Cited

U.S. PATENT DOCUMENTS

2002/0039269 A1   4/2002 Kumagai et al.
2004/0228057 A1   11/2004 Mayama et al.
(Continued)

FOREIGN PATENT DOCUMENTS

CN   201146457 Y   11/2008
EP   1988633 A1    11/2008
(Continued)

*Primary Examiner* — Danny Nguyen
(74) *Attorney, Agent, or Firm* — Rabin & Berdo, P.C.

(57) ABSTRACT

An IGBT provided on the high voltage side uses the sensing function of the IGBT to detect a current and prevents the IGBT from breaking due to an overcurrent through a gate drive unit when the current detected by the short-circuit protection unit is determined to be an overcurrent. When detecting an overcurrent, the short-circuit protection unit outputs an alarm signal to a composition unit. Also, it detects the temperature of the power semiconductor module by using a temperature detection element, converts the detected temperature into a digital signal in the temperature information generating unit, and outputs the digitized temperature information to the composition unit. The composition unit composites the temperature information and the alarm signal and one resultant composite output is transmitted to a control unit on the low voltage side.

18 Claims, 7 Drawing Sheets (51) Int. Cl.
*H02H 3/16* (2006.01)
*H03K 17/18* (2006.01)
*H03K 19/173* (2006.01)
H02H 3/08 (2006.01)
H02H 9/02 (2006.01)
H03K 17/08 (2006.01)

(52) U.S. Cl.
CPC ......... *H03K 17/18* (2013.01); *H03K 19/1732* (2013.01); *H02H 3/08* (2013.01); *H02H 9/02* (2013.01); *H03K 2017/0806* (2013.01)

(56) References Cited

U.S. PATENT DOCUMENTS

2009/0052214 A1 2/2009 Edo et al.
2010/0014195 A1* 1/2010 Takahashi .......... H03K 17/0822
361/18

FOREIGN PATENT DOCUMENTS

| JP | H07-115354 A | 5/1995 |
| JP | H11-17508 A | 1/1999 |
| JP | 2002-027665 A | 1/2002 |
| JP | 2008-270548 A | 11/2008 |
| JP | 2008-277484 A | 11/2008 |
| JP | 2009-171312 A | 7/2009 |
| JP | 2011-101466 A | 5/2011 |

* cited by examiner

DRIVE CONTROL METHOD OF POWER SEMICONDUCTOR MODULE AND CONTROL CIRCUIT OF POWER SEMICONDUCTOR MODULE

CROSS REFERENCE TO RELATED APPLICATION

This application is a continuation of the PCT application PCT/JP2014/075346 which was filed on Sep. 25, 2014, which was not published under PCT Article 21(2) in English.

This application is based upon and claims the benefit of priority from the prior Japanese Patent Application No. 2013-242221, filed Nov. 22, 2013, the entire contents of which are incorporated herein by reference.

TECHNICAL FIELD

The present invention relates to a drive control method and a drive control circuit of a power semiconductor module that reduce the number of insulation elements provided on the boundary between the high voltage side and the low voltage side by compositing temperature information and an alarm signal obtained from a power semiconductor module on the high voltage side and by transmitting the signal to a control unit on the low voltage side via one insulation element such as a photocoupler etc.

BACKGROUND ART

A power semiconductor module provided with an insulated gate bipolar transistor with a sensing function (referred to simply as an IGBT hereinafter), which is a type of power semiconductor device, a free-wheeling diode (referred to as an FWD simply hereinafter), which is connected in parallel to the IGBT so as to cause a current to flow in the direction opposite to the current flowing to the IGBT, and a temperature detection diode that detects temperatures in a module are widely used in power conversion devices such as an inverter, a chopper circuit, etc. Note that an IGBT, an FWD and a temperature detection diode that constitute a power semiconductor module are formed on one or a plurality of semiconductor chips.

In order to control a power semiconductor module as described above, a method is generally known in which an output current (specifically, a current flowing to the sensing area of an IGBT) is detected so as to detect a presence or absence of a short circuit in order to prevent the power semiconductor module from breaking and to suppress a temperature increase in the power semiconductor module by detecting the temperature in the module (see Patent Document 2).

Figure 1:
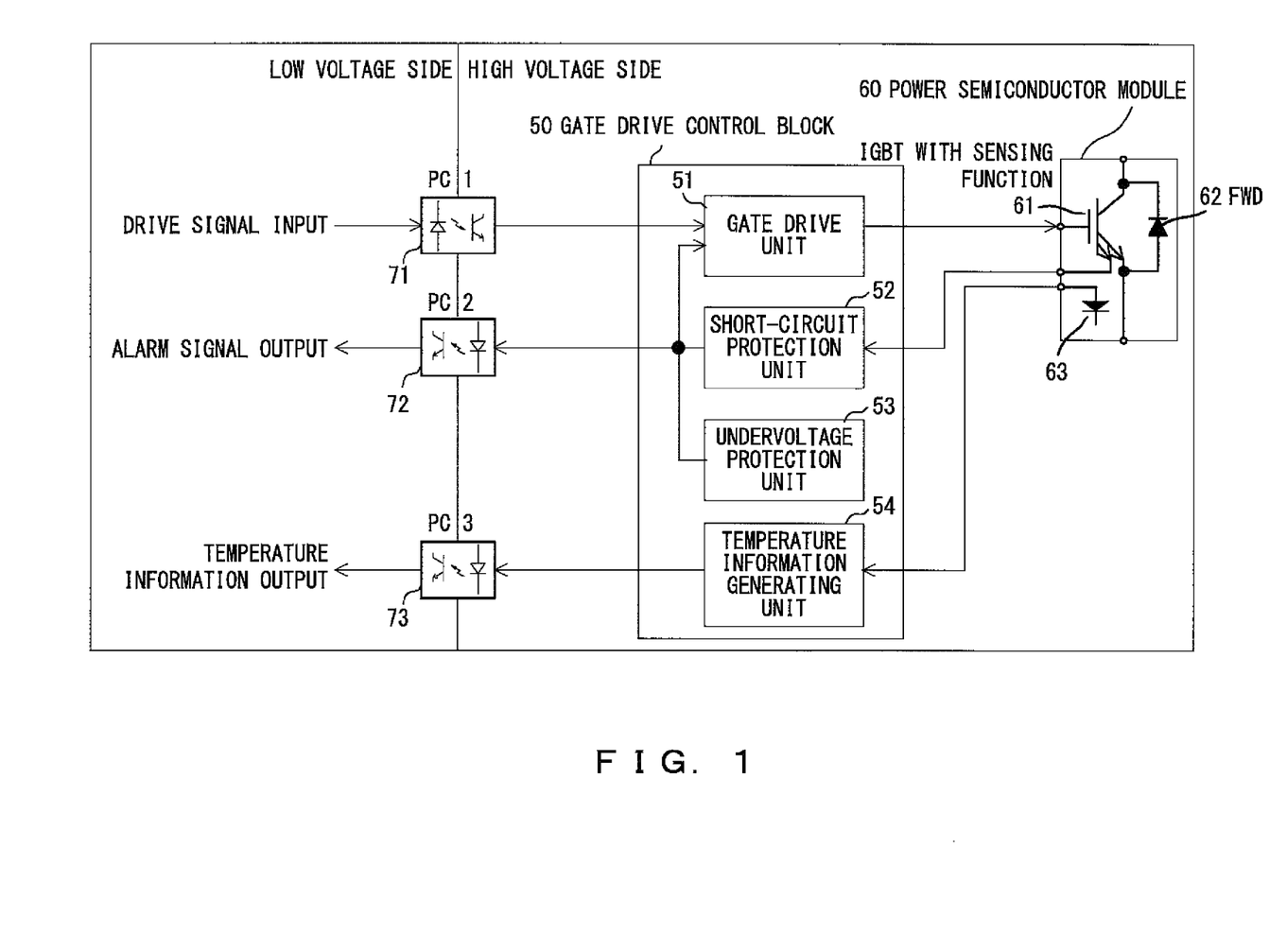
FIG. 1 shows a configuration of a conventional drive control method of a power semiconductor module.

FIG. 1 shows a configuration of a conventional drive control method of a power semiconductor module. In FIG. 1, a gate drive unit 51 provided on the high voltage side applies a prescribed drive voltage to the gate of an IGBT 61 so as to make the IGBT operate, and receives, in a gate drive unit 51, signal output from a short-circuit protection unit 52 and an undervoltage protection unit 53 serving as protection units that respond to abnormality in a semiconductor module (which will be described later), so as to protect the IGBT 61. The undervoltage protection unit 53 protects the gate drive unit 51 by detecting a decrease indirect current voltage (not shown) applied to the gate drive unit 51 so as to compensate for the shortage of voltage. Also, the short-circuit protection unit 52 operates as described below so as to protect the gate drive unit 51 and also protects a power semiconductor module 60.

In other words, the IGBT 61 provided on the high voltage side uses the sensing function of the IGBT to detect the principal current that flows to the IGBT, detects by using the short-circuit protection unit 52 whether or not the detected principal current has exceeded a predetermined overcurrent protection level continuously for a prescribed period of time, determines, when detecting an overcurrent, the overcurrent and prevents the IGBT from breaking due to the overcurrent by interrupting the switch control of the IGBT 61 to be conducted by the gate drive unit 51. Meanwhile, when an overcurrent has been detected, the short-circuit protection unit 52 transmits an alarm signal to a control unit (not shown) from an alarm signal output terminal provided on the low voltage side via a photocoupler (PC2) 72 provided between the high voltage side and the low voltage side. Usually, a latch period is set for an alarm signal so that an alarm state is maintained during the latch period, and the alarm is responded to before the expiration of the alarm latch period (for example, cancellation of the alarm etc. if possible).

The temperature of a board including a power semiconductor module is detected by using a temperature detection element (for example, a temperature detection diode) 63 provided on the board (semiconductor board (chip), a printed circuit board, etc.) that mounts the power semiconductor module 60, the detected temperature is converted into a digital signal (which will be explained later) by using a temperature information generating unit 54, and the digitized temperature information is transmitted to a control unit (not shown) from a temperature information output terminal provided on the low voltage side via a photocoupler (PC3) 73 provided between the high voltage side and the low voltage side.

In the above, the gate drive unit 51, the short-circuit protection unit 52, the undervoltage protection unit 53 and the temperature information generating unit 54 constitute a gate drive control block 50, and usually this gate drive control block 50 is realized in an integrated form.

The control unit (not shown) provided on the low voltage side includes for example a central processing unit (CPU) or a logic IC or a system LSI including a logic IC and a CPU, etc., receives an alarm signal and temperature information transmitted from the high voltage side via the photocoupler (PC2) 72 and the photocoupler (PC3) 73, and instructs via the drive signal input terminal and a photocoupler (PC1) 71 the gate drive unit 51 to analyze their contents and conduct prescribed processes. When for example the control unit (not shown) has determined from the analysis of an alarm state that it is necessary to protect the power semiconductor module 60 from an overcurrent, the gate drive unit 51 is instructed via the drive signal input terminal and the photocoupler (PC1) 71 to halt the on/off operation of the IGBT 61 and to fix it to off.

When the obtained temperature information has exceeded a prescribed threshold, the control unit (not shown) transmits to the gate drive unit 51 an instruction to decrease overloads via the drive signal input terminal and the photocoupler (PC1) 71 similarly to the above, so that the operation of decreasing overloads is conducted in order to decrease the temperature of the power semiconductor module 60. The outline of a system that conducts this control is disclosed by for example Patent Document 2 below.

Figure 2:
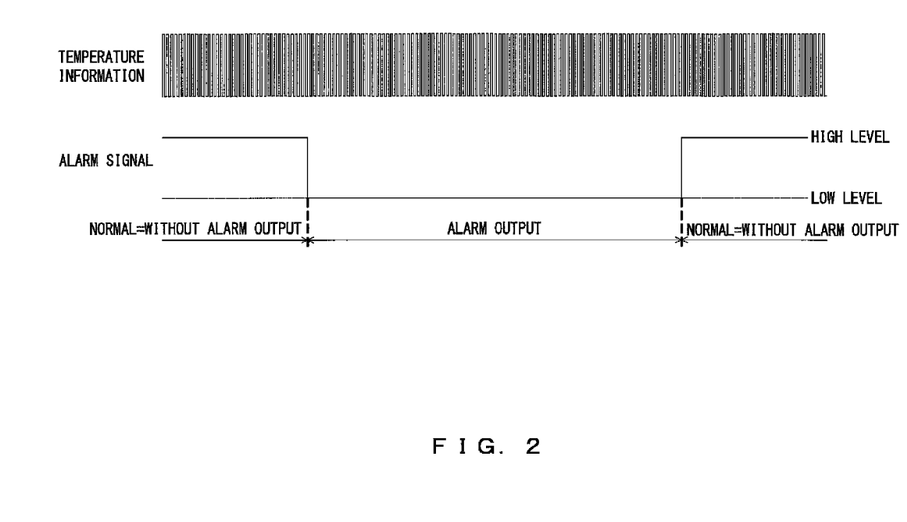
FIG. 2 shows signal waveforms related to temperature information and an alarm signal in a conventional drive control method of a power semiconductor module.

FIG. 2 shows signal waveforms related to temperature information and an alarm signal in a conventional drive control method of a power semiconductor module. The temperature information in FIG. 2 is a PWM signal whose duty ratio of pulse ON width is determined by the temperature detected by the temperature detection element 63, and is transmitted to the control unit (not shown) on the low voltage side from the temperature information generating unit 54 via the photocoupler (PC3) 73. Also, the alarm signal in FIG. 2 represents a high level state in a normal operation without alarm output, represents a waveform that includes a binary state so that a low level state can be represented in a protection operation with alarm output, and is transmitted from the short-circuit protection unit 52 to the control unit (not shown) on the low voltage side via the photocoupler (PC2) 72.

Figure 3:
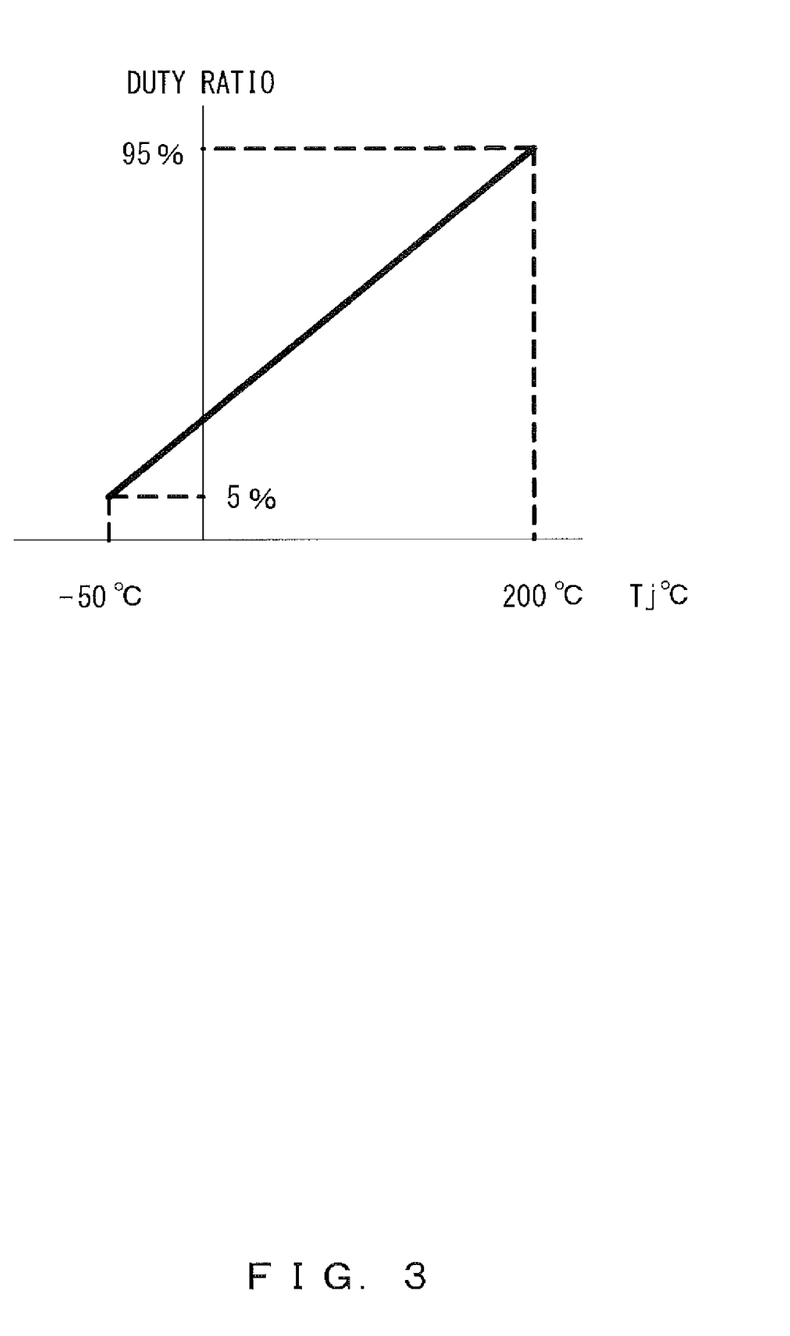
FIG. 3 shows the setting of a duty ratio of a pulse ON width with respect to temperature information in a conventional drive control method of a power semiconductor module.

FIG. 3 shows the setting of a duty ratio of the above pulse ON width with respect to temperature information in the conventional drive control method of a power semiconductor module.

FIG. 3 shows the setting of the duty ratio of the pulse ON width with respect to temperature information with the horizontal axis representing the junction temperature ($Tj°$ C.) of the IGBT at $-50°$ C. through $200°$ C. and the vertical axis representing the duty ratio (in the range from 5% through 95%) with respect to prescribed cycles of the pulse ON width corresponding to them. The frequency of a PWM signal used for outputting temperature information in FIG. 2 is usually set to several kHz, making it necessary to illustrate more precisely the transitions of duty ratios of a PWM signal used for outputting temperature information in order to express temperature information more accurately. However, a fine pulse ON width expressing a PWM signal, which requires too complicated an illustration, is omitted in FIG. 3.

Patent Document 1 below discloses a signal transmission circuit using an air-core insulation transformer that is separated into upper and lower arms, in which switching elements SWU and SWD are provided, switching elements SWU and SWD are driven by gate drivers IC8 and IC7 having a protection function and alarm output (alarm signals) of SU2 and SD2 and temperature information output of SU3 and SD3 are transmitted separately to the control unit side via insulation transformers TU2, TD2; TU3, TD3 from the side of a gate driver IC having a protection function.

Patent Document 2 below discloses an intelligent power module that provides as many insulation elements and terminals as there are signals. Specifically, an alarm signal propagation unit 11 includes a photocoupler (insulation element) and a temperature information propagation unit 12 also includes a photocoupler. Further, it is disclosed that an alarm signal and temperature information are output parallelly to the alarm signal propagation unit 11 and the temperature information propagation unit 12 from an intelligent power module 1.

As shown in FIG. 1, three photocouplers are required for a one-phase IGBT and the number of photocouplers increases for a larger IPM (Intelligent Power Module), also increasing the number of transmission terminals and reception terminals, leading to a wider space for mounting them and also leading to a higher cost. For example, a six-phase IPM having a three-phase inverter requires 18 photocouplers (3 (the number/phase) by 6 phases=18), leasing to a larger scale of device configuration due to increase in connection terminals for such photocouplers and also increasing the cost, which is problematic.

The conventional technique disclosed by Patent Document 1 above employs a configuration in which an alarm signal and temperature information are separately insulated by insulation transformers (insulation elements) to be output, increasing the number of insulation elements and also increasing the number of input terminals and output terminals so that reception is possible by using the insulation elements.

The conventional technique disclosed by Patent Document 2 above employs a configuration in which photocouplers are used as insulation elements and an alarm signal and temperature information are electrically insulated by separate photocouplers and are output, increasing the number of insulation elements and the number of input terminals and output terminals for transmitting and receiving signals via insulation elements, similarly to the Patent Document 1, which is problematic.

As described above, in a drive control method of the above conventional power semiconductor module, temperature information and an alarm signal are generated by separate circuits and the temperature information and the alarm signal are transmitted via different insulation elements such as photocouplers, increasing the number of insulation elements and also increasing the number of input terminals and output terminals for transmitting and receiving signals via insulation elements, which is problematic.

Patent Document 1: Japanese Laid-open Patent Publication No. 2008-277484 (FIG. 1)
Patent Document 2: Japanese Laid-open Patent Publication No. 07-115354 (FIG. 1 and FIG. 3)

DISCLOSURE OF THE INVENTION

It is a first object of the present invention to reduce the number of insulation elements for complete electrical insulation between input and output by compositing temperature information and an alarm signal obtained from a power semiconductor module on the high voltage side and transmitting the result to a control unit on the low voltage side via one insulation element.

It is a second object of the present invention to reduce the number of terminals for transmitting signals from the high voltage side to the low voltage side by compositing temperature information and an alarm signal obtained from a power semiconductor module on the high voltage side and transmitting the result to a control unit on the low voltage side via one insulation element.

Accordingly, a drive control method of a power semiconductor module according to the present invention is a drive control method of a power semiconductor module in which a drive control circuit and a power semiconductor module are arranged on a high voltage side and a control unit that controls the drive control circuit arranged on the high voltage side is arranged on a low voltage side, wherein the drive control circuit includes a gate drive unit configured to apply a prescribed voltage to a gate of a power semiconductor device and to control ON and OFF of the power semiconductor device, a protection unit configured to respond to an abnormal state of the power semiconductor device and to output an alarm signal when an abnormal state has been detected, a temperature information generating unit configured to convert, into a digital signal, temperature detected by a temperature detection element arranged on a board of the power semiconductor module and to generate temperature information, and a composition unit to which the alarm signal and temperature information generated by the temperature information generating unit are input and which composites the alarm signal and temperature information that were input, wherein the composition unit composites temperature information obtained from the power semiconductor module and an alarm signal and outputs composite output of the temperature information and the alarm signal to one insulation element provided between the high voltage side and the low voltage side.

In the above, the protection unit includes a short-circuit protection unit configured to interrupt control of ON and OFF of the power semiconductor device conducted by the gate drive unit and output an overcurrent alarm signal when an overcurrent of the power semiconductor device has been detected, and the alarm signal is based on the overcurrent alarm signal.

In the above, the protection unit includes an overheat protection unit configured to conduct overheat protection of the power semiconductor device semiconductor module and to output an overheat alarm signal, and the alarm signal is based on the overheat alarm signal.

In the above, the composition unit includes an AND circuit that conducts an AND operation between the temperature information and the alarm signal.

In the above, the composition unit composites the temperature information input by being inserted into an input/output route of the temperature information and the alarm signal, and outputs a result, and includes a switch that blocks/allows passage of input of the temperature information in accordance with the alarm signal.

In the above, the switch is connected between a temperature information input/output terminal and reference potential, and ON and OFF of the switch is controlled by the alarm signal.

In the above, the switch includes an NPN transistor, a collector of the NPN transistor is connected to the temperature information input/output terminal, an emitter is connected to the reference potential, a base is connected to an output side of an inverting circuit, and an input side of the inverting circuit is connected to the alarm signal input terminal.

In the above, the switch includes a PNP transistor, an emitter of the PNP transistor is connected to the temperature information input/output terminal, a collector is connected to the reference potential, and a base is connected to the alarm signal input terminal.

In the above, it is desirable that the insulation element be a photocoupler.

In the above, a control circuit of a power semiconductor module according to the present invention is a drive control circuit that is provided on a high voltage side and that controls a power semiconductor module provided on a high voltage side, the drive control circuit including a gate drive unit configured to apply a prescribed voltage to a gate of a power semiconductor device and to control ON and OFF of the power semiconductor device, a short-circuit protection unit configured to interrupt control of ON and OFF of the power semiconductor device conducted by the gate drive unit and output an alarm signal when an overcurrent of the power semiconductor device has been detected, a temperature information generating unit configured to convert, into a digital signal, a temperature detected by a temperature detection element arranged on a board of the power semiconductor module and to generate temperature information, and a composition unit to which the alarm signal and temperature information generated by the temperature information generating unit are input and which composites the alarm signal and temperature information that were input, wherein the composition unit composites temperature information obtained from the power semiconductor module and an alarm signal, and outputs composite output of the temperature information and the alarm signal to one insulation element provided between the high voltage side and the low voltage side.

According to the present invention, it is possible to reduce, by one, the number of insulation elements such as a photocoupler required for each one-phase IGBT, making it possible to secure an advantage in mounting space and cost by reducing, to a large degree, the number of insulation elements such as photocouplers when it is applied to a large system such as a three-phase inverter having a six-phase IPM (it is possible to reduce six insulation elements for a six-phase IPM) compared to the conventional technique.

Also, according to the present invention, it is possible to reduce the number of terminals for transmitting signals between input and output required for photocouplers, making it possible to secure an advantage in the mounting space and cost.

DESCRIPTION OF THE PREFERRED EMBODIMENTS

Hereinafter, the embodiments of the present invention will be explained by referring to the drawings.

Figure 4:
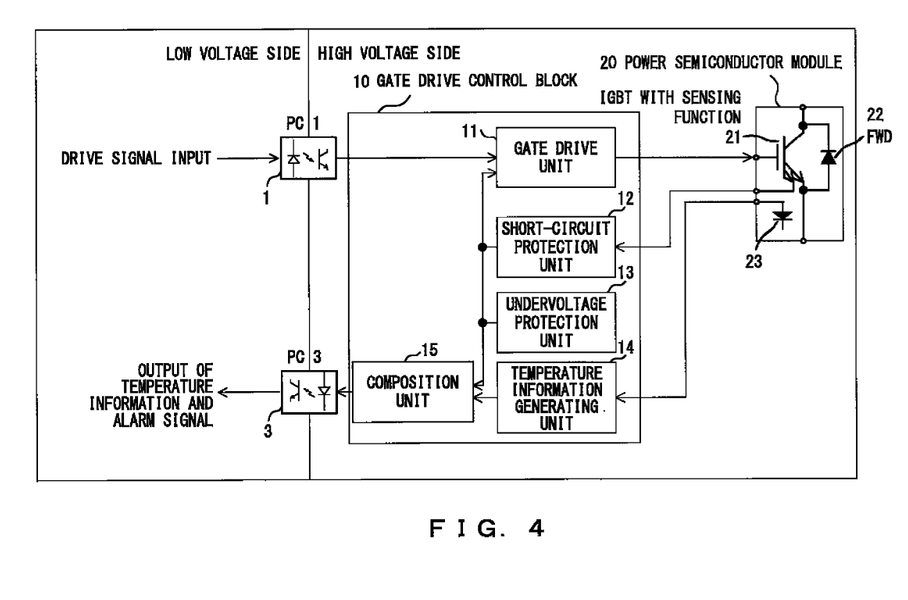
FIG. 4 shows a configuration of a drive control method of a power semiconductor module according to an embodiment of the present invention.

FIG. 4 shows a configuration of a drive control method of a power semiconductor module according to the embodiment of the present invention.

A power semiconductor module 20 shown in FIG. 4, similarly to the conventional example shown in FIG. 1, includes an insulated gate bipolar transistor 21 having a sensing function (referred to as IGBT simply hereinafter), which is a type of power semiconductor devices, a freewheeling diode (referred to as an FWD simply hereinafter) 22, which is connected in parallel to the IGBT so as to cause a current to flow a current in the direction opposite to the current flowing to the IGBT, and a temperature detection diode 23 that detects temperature in a module. Note that the IGBT, the FWD and the temperature detection diode that constitute this power semiconductor module are formed on one or a plurality of semiconductor chips. Also, it is also possible to use a different temperature detection element such as a thermistor in place of the temperature detection diode.

In FIG. 4, a gate drive unit 11 provided on the high voltage side applies a prescribed drive voltage to the gate of the IGBT 21 so as to operate the IGBT 21, and also receives signal output from the a short-circuit protection unit 12 and a undervoltage protection unit 13 serving as protection units that respond to a semiconductor module, which will be described later, so as to protect the IGBT 21. The undervoltage protection unit 13 detects a decrease indirect current voltage (not shown) applied to the alarm signal propagation unit 11 so as to compensate for the shortage of voltage, and protects the gate drive unit 11. Also, the short-circuit protection unit 12 operates as described below so as to protect the gate drive unit 11 and also protects the power semiconductor module 20.

In other words, the IGBT 21 provided on the high voltage side uses the sensing function of the IGBT to detect the principal current that flows to the IGBT, detects by using the short-circuit protection unit 12 whether or not the detected principal current has exceeded a predetermined overcurrent protection level continuously for a prescribed period of time, determines an overcurrent, and prevents the IGBT from breaking due to the overcurrent by interrupting the switch control of the IGBT 21 by the gate drive unit 11 when an overcurrent was detected. Meanwhile, detecting an overcurrent, the short-circuit protection unit 12 outputs an alarm signal to a composition unit 15. Usually, a latch period is set in an alarm signal so that an alarm state is maintained during the latch period, and an action is taken in response to the alarm before the expiration of the alarm latch period (for example, cancellation of the alarm etc. if possible).

Figure 5:
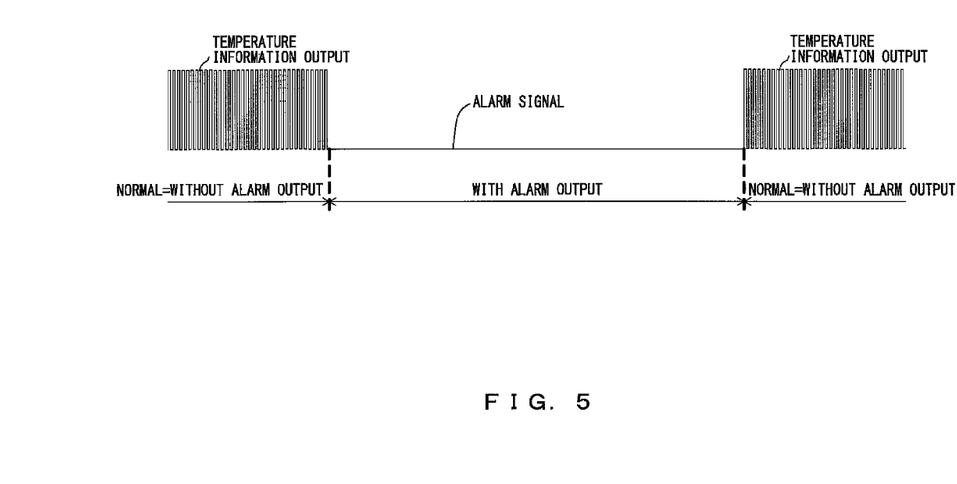
FIG. 5 shows signal waveforms after composite output of temperature information and an alarm signal according to an embodiment of the present invention.

The temperature of a board including a power semiconductor module 20 is detected by using a temperature detection element 23 (for example, a temperature detection diode) provided on a board (semiconductor board (chip), a printed circuit board, etc.) that mounts the power semiconductor module 20, the detected temperature is converted into a digital signal (which will be explained later) by using a temperature information generating unit 14, and the digitized temperature information is output to the composition unit 15. As shown in FIG. 5, only temperature information is output in a normal operation without alarm output and output of temperature information and an alarm signal are composited in a protection operation with alarm output, and a low level signal, which is the composite output, is transmitted to the control unit (not shown) from the output terminals of temperature information and alarm signals provided on the low voltage side via a photocoupler 3 (PC3) provided between the high voltage side and the low voltage side.

In the above, the gate drive unit 11, the short-circuit protection unit 12, the undervoltage protection unit 13, the temperature information generating unit 14 and the composition unit 15 constitute a gate drive control block (drive control circuit) 10, and usually this gate drive control block 10 is realized in an integrated form.

The control unit (not shown) provided on the low voltage side includes for example a central processing unit (CPU), a logic IC or a system LSI including a logic IC and a CPU, etc., and instructs via the drive signal input terminal and a photocoupler 1 (PC1) the gate drive unit 11 to analyze the contents of the temperature information and the alarm signal obtained from the high voltage side via the photocoupler 3 (PC3) and conduct prescribed processes. When for example the control unit (not shown) has determined from the analysis of an alarm signal obtained in the photocoupler 3 (PC3) via the composition unit 15 that it is necessary to protect the power semiconductor module 20 from an overcurrent, the gate drive unit 11 is instructed via the photocoupler 1 (PC1) to halt the on/off operation of the IGBT 21 and to fix it to off.

Also, the control unit (not shown) instructs, via the drive signal input terminal and the photocoupler 1 (PC1), the gate drive unit 11 to conduct a process of decreasing the temperature of the power semiconductor module 20 by analyzing the contents of the temperature information output obtained in the photocoupler 3 (PC3) via the composition unit 15. An example of a process of decreasing the temperature of the power semiconductor module 20 is an operation of transmitting an instruction to reduce overloads to the gate drive unit 11 via the drive signal input terminal and the photocoupler 1 (PC1) so as to make it operate to reduce overloads.

As described above, the drive control method of a power semiconductor module according to the embodiment of the present invention shown in FIG. 4 employs a configuration in which composite output of temperature information and an alarm signal obtained on the high voltage side are transmitted via one photocoupler 3 (PC3) to the control unit (not shown) provided on the low voltage side, making it possible to reduce the number of photocouplers compared to the conventional configuration (specifically, it is possible to reduce one photocoupler for a one-phase IGBT).

Also, the drive control method of the power semiconductor module according to the embodiment of the present invention shown in FIG. 4 employs a configuration in which composite output of temperature information and an alarm signal obtained on the high voltage side are transmitted, via one photocoupler 3 (PC3), to the control unit (not shown) provided on the low voltage side, making it possible to reduce the number of terminals for signal transmission between input and output compared to the conventional configuration. In other words, a reduction in the number of terminals leads to a reduced number of the corresponding terminals on the partner side of signal transmission, leading as a general rule to a reduction in the scale of apparatuses and the cost.

FIG. 5 shows signal waveforms after composite output of temperature information and an alarm signal in a drive control method of a power semiconductor module according to the embodiment of the present invention.

As shown in FIG. 5, the signal waveform after composite output in a normal operation (without alarm output) indicates that only temperature information is output. The signal waveform after composite output in a protection operation (with alarm output) indicates that temperature information is not output and only an alarm (signal) is output. In other words, the composite output waveform between temperature information and an alarm signal in a protection operation (with alarm output) is fixed to a low level (a specific description of this will be given later) and a PWM (pulse width modulation) signal indicating that the temperature information output is not output. Because a latch period is set for an alarm signal so that an alarm signal of a low level is maintained for a prescribed period, the low level of a PWM signal, representing temperature information output, and the low level of an alarm signal can be identified by their duration times. Accordingly, a signal for indicating which of the two the low level is related to is not necessary.

This point is described in more detail. As described above, temperature (analog signal) detected by the temperature detection element 23 in the temperature information generating unit 14 receives pulse width modulation (PWM) and is converted into digital information. In such a case, the modulated frequency of a PWM signal, which usually represents output of the temperature information, is several kHz. Accordingly, even when the above low-level period representing the presence of the alarm output is in a PWM signal with a modulated frequency of 1 kHz, a period during which the low level of the alarm signal is latched (latch period) is usually equal to or longer than about 10 ms because a low level period=1/1 kHz×95%=950 µs (where 95% is the maximum value of the duty ratio of the pulse ON width shown in FIG. 3 (a period in which it is at a low level) is satisfied, and accordingly it is possible to identify this low level period (=alarm output period) on the low voltage side that receives the alarm signal (such as identifying it from the low level period when the duty ratio of the PWM signal, representing temperature information output, is 95%, i.e., the maximum).

Figure 6:
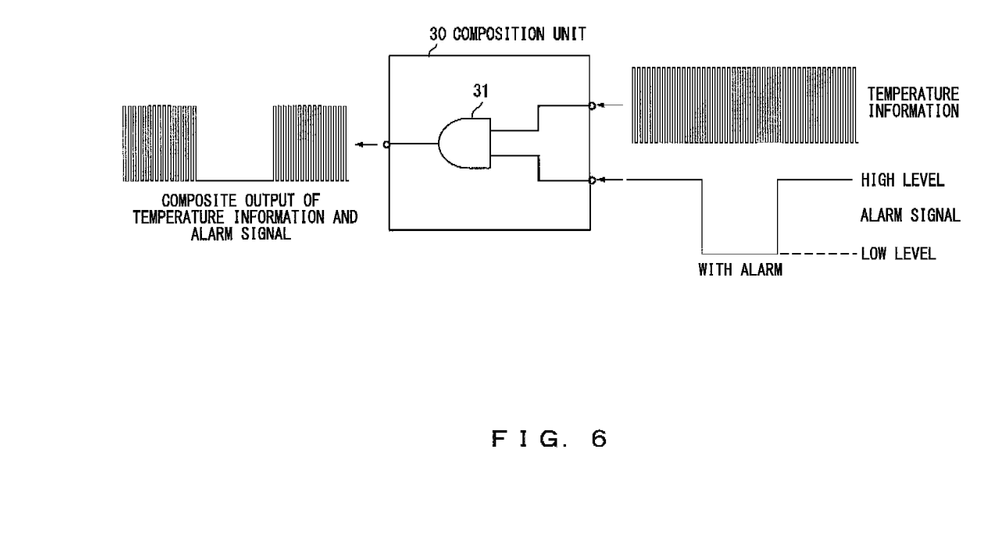
FIG. 6 shows a first example of a composition unit according to an embodiment of the present invention.

FIG. 6 shows a first example of a composition unit according to the embodiment of the present invention shown in FIG. 4. In FIG. 6, a composition unit 30 includes an AND circuit 31 that conducts an AND operation between temperature information and an alarm signal. In a normal operation (without alarm output), an alarm signal is set to a high level, and a PWM signal, representing output of temperature information, is output to the output side after passing through the AND circuit 31. In other words, a PWM signal having passed through the AND circuit 31 is applied to the anode of the light emitting diode of the photocoupler 3 (PC3), making it possible to detect this by using the control unit (not shown) on the low voltage side.

In a protection operation (with alarm output), an alarm signal is set to a low level, and accordingly, a PWM signal, representing output of temperature information, is not output to the output side because a PWM signal, representing output of temperature information, is prevented from passing through the AND circuit 31. The output side of the AND circuit 31 is set to a low level only in the low level period of the alarm signal, and this signal of the low level is input to the light emitting diode of the photocoupler 3 (PC3). This makes it possible to detect, by using the control unit (not shown) on the low voltage side, that the presence of an alarm was output as the composite output between temperature information and an alarm signal from the composition unit 30.

When the cause of the alarm has been solved during the latch period, because the alarm signal is set to a high level after the low level has been output only during the low level period in which the output side of the AND circuit 31 has an alarm, a PWM signal, representing output of temperature information, passes through the AND circuit 31 and is applied to the anode of the light emitting diode of the photocoupler 3 (PC3). Thereby, it is possible to detect again a PWM signal, representing output of temperature information, by using the control unit (not shown) on the low voltage side.

Figure 7:
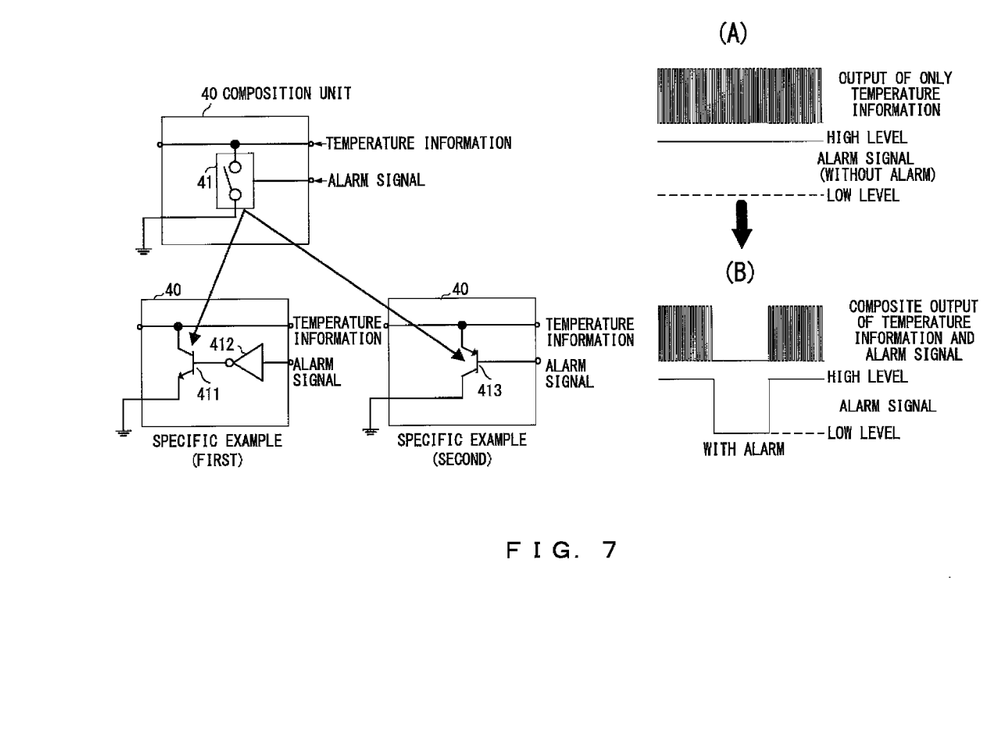
FIG. 7 shows a second example of a composition unit according to an embodiment of the present invention.

FIG. 7 shows a second example of the composition unit according to the embodiment of the present invention shown in FIG. 4. A composition unit 40 in the upper left portion in FIG. 7 composites temperature information input by being inserted into an input/output route of temperature information and an alarm signal so as to output the result, and includes a switch 41 that blocks/allows passage of input of temperature information in accordance with a presence or absence of an alarm. When there is alarm output, the switch 41 is turned ON and the reference potential (ground, i.e., low level) is output from the output terminal of the composition unit 40 without a PWM signal being output from the temperature information input terminal as the composite output of the temperature information and the alarm signal because the input/output route of the temperature information is fixed to a low level for the period during which the alarm output is presented (the latch period or the period during which a cause of alarm remains). When there is no alarm output, the switch 41 is turned OFF, and because the input/output route of the temperature information is not connected to the reference potential, a PWM signal of temperature information is output from the output terminal of the composition unit 40.

"(A)" appearing in the right portion in FIG. 7 shows a situation in which a PWM signal input to the temperature information input terminal is continuously output from the composition unit 40 to the light emitting unit of the photocoupler 3 (PC3) when the switch 41 is in an OFF state without alarm output in the above configuration.

"(B)" appearing in the right portion in FIG. 7 shows a situation in which when the switch 41 has been turned ON with alarm output, because the input/output route of the temperature information is fixed to the low level for the period during which alarm output is presented, the PWM signal of the temperature information input terminal is not output to the output side (light emitting unit of the photocoupler 3 (PC3)).

The circuits shown in the lower left portion in FIG. 7 show specific examples 1 and 2 of the switch in the above composition unit 40. In specific example 1 of the switch, the collector of an NPN transistor 411 is connected to the temperature information input/output terminal of the composition unit 40, the emitter is connected to the reference potential (ground), the base is connected to the output side of an inverter (inverting circuit) 412, and the input side of the inverter (inverting circuit) 412 is connected to the alarm input terminal.

When the input side of the inverter 412 is at a low level along with alarm input (alarm signal is at a low level), the output side of the inverter 412 becomes a high level, and this high level signal is applied to the base of the NPN transistor 411 so that the NPN transistor 411 becomes conductive. Thereby, the composite output of the temperature information and the alarm signal in the composition unit 40 is fixed to the reference potential (ground) without the PWM signal of the temperature information input terminal being transmitted to the output side (light emitting unit of the photocoupler 3 (PC3)) because the input/output route of the temperature information is fixed to the low level for the period during which alarm output is presented.

When the input side of the inverter 412 is at a high level without there being alarm output (alarm signal is at a high level), the output side of the inverter 412 becomes a low level, and this low level signal is applied to the base of the NPN transistor 411 and the NPN transistor 411 becomes nonconductive. Thereby, the composite output between the temperature information and the alarm signal in the composition unit 40 becomes identical to the PWM signal to be input to the temperature information input terminal and the PWM signal is continuously output to the output side (the light emitting unit of the photocoupler 3 (PC3)) because the input/output route of the temperature information is not connected to the reference potential.

In specific example 2 of the switch, the emitter of a PNP transistor 413 is connected to the temperature information input/output terminal of the composition unit 40 and the collector is connected to the reference potential (ground), and the base is connected to the alarm input terminal.

When the alarm input terminal has become a low level with alarm output (alarm signal is at a low level), the PNP transistor 413 becomes conductive. Thereby, because the input/output route of the temperature information is fixed to a low level for the period during which alarm output is presented, the composite output of the temperature information and the alarm signal in the composition unit 40 is fixed to the reference potential (ground) without the PWM signal of the temperature information input terminal being transmitted to the output side (the light emitting unit of the photocoupler 3 (PC3)). When the alarm input terminal has become a high level without alarm output (alarm signal is high level), the PNP transistor 413 becomes nonconductive. Thereby, because the input/output route of the temperature information is not connected to the reference potential, the composite output between the temperature information and the alarm signal in the composition unit 40 becomes identical to the PWM signal input to the temperature information terminal, and the PWM signal is continuously output to the output side (light emitting unit of the photocoupler 3 (PC3)).

The setting of temperature information and a pulse ON width (duty ratio) in the drive control method of a power semiconductor module according to the embodiment of the present invention is similar to that shown in FIG. 3 above, and is omitted here.

Also, as a method of digitizing temperature information, it is possible to use frequency modulation, a method in which temperature information is transmitted in a coded form, etc. in addition to the above. Regardless of what method is used, it is sufficient as long as the maximum period of a low level is shorter than the latch period of the alarm signal.

Although a configuration has been described in which the composite output waveform is fixed to a low level in a protection operation with alarm output, it is also possible to obtain information along with alarm output on the signal reception side (low voltage side) by conducing frequency modulation etc. that is different from the modulation scheme used for transmitting temperature information output to the output side in a case where alarm output is present. As a matter of course, any modulation method can be employed without being limited to frequency modulation as long as such modulation methods permit reception on the low voltage side.

As is obvious from the above explanations, the present invention makes it possible to reduce to two the number of photocouplers, which were required to be three for one-phase IGBT conventionally, and thereby to reduce the number of photocouplers in a case when it is applied to a large system such as a three-phase inverter having a six-phase IPM (it is possible to reduce the number of photocouplers by six in a six-phase IPM). This makes it possible to secure an advantage in view of the mounting space and cost.

Also, according to the present invention, it is possible to reduce the number of terminals for transmitting signals between input and output that are required for a photocoupler, making it possible to secure an advantage in view of the mounting space and cost.

Although explanations have been given for a short-circuit protection unit that outputs an alarm signal related to a short circuit as an example of a protection unit, the scope of the present invention is not limited to this. For example, it is also possible to employ a configuration in which an overheat protection unit is included and when the overheat unit has detected an overheating of a semiconductor module on the basis of temperature information, overheat protection of the semiconductor module is conducted on the high voltage side, an alarm signal related to the overheating is output, and this alarm signal related to the overheating or one alarm signal obtained by combining the signal with an alarm signal related to other factors such as a short circuit is used as an alarm signal according to the present invention.

Also, while explanations have been given for an embodiment that uses a photocoupler as an insulation element, the scope of the present invention is not limited to this, and an insulation transformer for example may also be used as an insulation element.

It is also possible to apply, as a composition unit, a multiplexer that selects one of temperature information and the reference potential on the basis of an alarm signal so as to output the selected information.

Also, explanations have been given on an assumption that the pulse ON width is a period during which the pulse is kept at a low level; however it is possible to employ a configuration in which the pulse ON width is a period during which the pulse is kept at a high level.

INDUSTRIAL APPLICABILITY

The present invention has been explained by using a photocoupler as an example of an insulation element for transmitting a signal from the high voltage side to the low voltage side; however, it is also possible to realize the present invention by using other insulation elements for signal transmission, such as for example an isolator IC.

What is claimed is:

1. A drive control method of a power semiconductor module in which a drive control circuit that includes a gate drive unit, a protection unit, a temperature information generating unit and a composition unit, the power semiconductor module are arranged on a high voltage side, and a control unit that controls the drive control circuit is arranged on a low voltage side, the method comprising the steps of:
   applying by the gate drive unit a prescribed voltage to a gate of a power semiconductor device and controlling ON and OFF of the power semiconductor device;
   responding by the protection unit to an abnormal state of the power semiconductor device and outputting an alarm signal when an abnormal state has been detected;
   converting into a digital signal, a temperature detected by a temperature detection element arranged on a board of the power semiconductor module and generating temperature information, by the temperature information generating unit; and
   inputting from the power semiconductor module to the composition unit the alarm signal and temperature information generated by the temperature information generating unit;
   compositing by the composition unit the inputted alarm signal and temperature information; and
   outputting the composited temperature information and alarm signal to one insulation element provided between the high voltage side and the low voltage side.

2. The drive control method of a power semiconductor module according to claim 1, further comprising the steps of
   interrupting control of ON and OFF of the power semiconductor device conducted by the gate drive unit by a short-circuit protection unit of the protection unit; and
   outputting by the short-circuit protection unit an overcurrent alarm signal when an overcurrent of the power semiconductor device has been detected, wherein the alarm signal is based on the overcurrent alarm signal.

3. The drive control method of a power semiconductor module according to claim 1, further comprising the steps of
   conducting overheat protection of the power semiconductor device semiconductor module by an overheat protection unit of the protection unit; and outputting by the overheat protection unit an overheat alarm signal, wherein the alarm signal is based on the overheat alarm signal.

4. The drive control method of a power semiconductor module according to claim 1, further comprising the step of conducting an AND operation between the temperature information and the alarm signal by an AND circuit of the composition unit.

5. The drive control method of a power semiconductor module according to claim 1, wherein said step of compositing includes the steps of
(a) compositing the temperature information input to the composition unit by inserting the temperature information into an input/output route of the temperature information and the alarm signal,
(b) outputting by the composition unit a result of said step (a), and
(c) blocking/allowing by a switch of the composition unit in accordance with the alarm signal, passage of the temperature information into the composition unit for compositing.

6. The drive control method of a power semiconductor module according to claim 1, wherein said step of compositing includes the steps of
blocking/allowing passage the temperature information into the composition unit in accordance with the alarm signal by a switch of the composition unit that is connected between a temperature information input/output terminal and a reference potential,
receiving the alarm signal and the temperature information via an input/output route, compositing the received temperature information and alarm signal, and outputting a result of the compositing, by the composition unit, and
controlling ON and OFF of the switch by the alarm signal.

7. The drive control method of a power semiconductor module according to claim 1, further comprising the steps of
blocking/allowing passage of the temperature information into the composition unit in accordance with the alarm signal, by a switch of the composition unit, the switch being connected between a temperature information input/output terminal and a reference potential, the switch including an NPN transistor, a collector of the NPN transistor being connected to the temperature information input/output terminal, an emitter of the NPN transistor being connected to the reference potential, a base of the NPN transistor being connected to an output side of an inverting circuit, and an input side of the inverting circuit being connected to the alarm signal input terminal;
receiving the temperature information via an input/output route of the temperature information, compositing the alarm signal and the received temperature information, and outputting a result of the compositing, by the composition unit; and
controlling ON and OFF of the switch by the alarm signal.

8. The drive control method of a power semiconductor module according to claim 1, further comprising the steps of
blocking/allowing passage of input of the temperature information by a switch of the composition unit in accordance with the alarm signal, the switch being connected between a temperature information input/output terminal and a reference potential, the switch including a PNP transistor, an emitter of the PNP transistor being connected to the temperature information input/output terminal, a collector of the PNP transistor being connected to the reference potential, and a base of the PNP transistor being connected to the alarm signal input terminal;
controlling ON and OFF of the switch by the alarm signal; and
receiving the temperature information input via an input/output route of the temperature information and the alarm signal, compositing the alarm signal and the received temperature information, and outputting a result of the compositing, by the composition unit.

9. The drive control method according to claim 1, wherein said step of outputting the composited temperature information and alarm signal to one insulation element is outputting the composited temperature information and alarm signal to a photocoupler.

10. The drive control method according to claim 2, wherein said step of outputting the composited temperature information and the alarm signal to one insulation element is outputting the composited temperature information and alarm signal to a photocoupler.

11. The drive control method according to claim 3, wherein said step of outputting the composited temperature information and alarm signal to one insulation element is outputting the composited temperature information and alarm signal to a photocoupler.

12. The drive control method according to claim 4, wherein said step of outputting the composited temperature information and alarm signal to one insulation element is outputting the composited temperature information and alarm signal to a photocoupler.

13. The drive control method according to claim 5, wherein said step of outputting the composited temperature information and alarm signal to one insulation element is outputting the composited temperature information and alarm signal to a photocoupler.

14. The drive control method according to claim 6, wherein said step of outputting the composited temperature information and alarm signal to one insulation element is outputting the composited temperature information and alarm signal to a photocoupler.

15. The drive control method according to claim 7, wherein said step of outputting the composited temperature information and alarm signal to one insulation element is outputting the composited temperature information and alarm signal to a photocoupler.

16. The drive control method according to claim 8, wherein said step of outputting the composited temperature information and alarm signal to one insulation element is outputting the composited temperature information and alarm signal to a photocoupler.

17. A drive control circuit that is provided on a high voltage side and that controls a power semiconductor module provided on a high voltage side, the drive control circuit comprising:
a gate drive unit configured to apply a prescribed voltage to a gate of a power semiconductor device and to control ON and OFF of the power semiconductor device;
a short-circuit protection unit configured to interrupt control of ON and OFF of the power semiconductor device conducted by the gate drive unit and output an alarm signal when an overcurrent of the power semiconductor device has been detected;
a temperature information generating unit configured to convert, into a digital signal, a temperature detected by a temperature detection element arranged on a board of the power semiconductor module and to generate temperature information; and a composition unit to which the alarm signal and temperature information generated by the temperature information generating unit are input and which composites the alarm signal and the inputted temperature information, wherein the composition unit composites temperature information obtained from the power semiconductor module, and an alarm signal, and outputs the composited temperature information and alarm signal to one insulation element provided between the high voltage side and the low voltage side.

18. The drive control circuit according to claim 17, wherein said one insulation element is a photocoupler.

* * * * *